United States Patent
Sonoyama

(10) Patent No.: US 8,952,369 B2
(45) Date of Patent: Feb. 10, 2015

(54) LIGHT-EMITTING ELEMENT, LIGHT-EMITTING DEVICE, DISPLAY DEVICE, AND ELECTRONIC APPARATUS

(71) Applicant: Seiko Epson Corporation, Tokyo (JP)

(72) Inventor: Takuya Sonoyama, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 35 days.

(21) Appl. No.: 13/921,576

(22) Filed: Jun. 19, 2013

(65) Prior Publication Data

US 2013/0341606 A1 Dec. 26, 2013

(30) Foreign Application Priority Data

Jun. 25, 2012 (JP) ................. 2012-142406

(51) Int. Cl.
  *H01L 29/08* (2006.01)
  *H01L 51/50* (2006.01)
(52) U.S. Cl.
  CPC .................. *H01L 51/5096* (2013.01)
  USPC ............................. 257/40; 257/88
(58) Field of Classification Search
  USPC ..................................... 257/40, 88
  See application file for complete search history.

(56) References Cited

U.S. PATENT DOCUMENTS

| 8,294,361 | B2 | 10/2012 | Masui et al. |
| 8,299,456 | B2 | 10/2012 | Seo et al. |
| 2009/0267498 | A1 | 10/2009 | Kawakami et al. |

FOREIGN PATENT DOCUMENTS

| JP | A-2009-280576 | 12/2009 |
| JP | A-2010-045222 | 2/2010 |
| JP | A-2010-080436 | 4/2010 |
| JP | A-2011-171269 | 9/2011 |
| JP | A-2011-176267 | 9/2011 |

*Primary Examiner* — Douglas Menz
(74) *Attorney, Agent, or Firm* — Oliff PLC

(57) ABSTRACT

A light-emitting element includes an anode, a cathode, a luminescent layer disposed between the anode and the cathode and containing a host material, a first luminescence-assisting layer disposed in contact with the luminescent layer between the anode and the luminescent layer and containing a first luminescence-assisting material having characteristics the same as or similar to the host material, and a second luminescence-assisting layer disposed in contact with the luminescent layer between the cathode and the luminescent layer and containing a second luminescence-assisting material having characteristics the same as or similar to the host material. The luminescent layer and the first luminescence-assisting layer each contain a high-molecular-weight material.

20 Claims, 7 Drawing Sheets

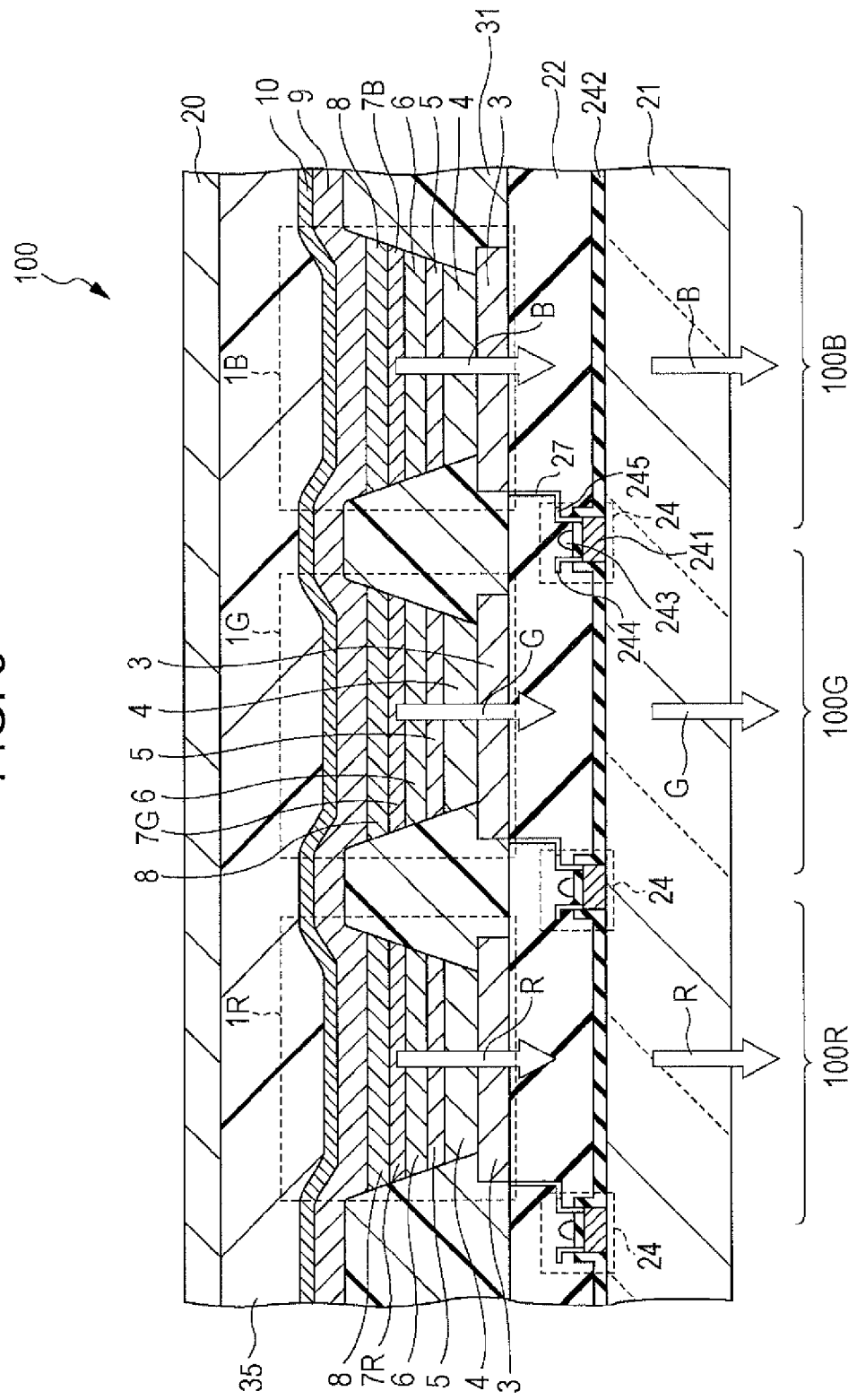

LIGHT-EMITTING ELEMENT, LIGHT-EMITTING DEVICE, DISPLAY DEVICE, AND ELECTRONIC APPARATUS

BACKGROUND

1. Technical Field

The present invention relates to a light-emitting element, a light-emitting device, a display device and an electronic apparatus.

2. Related Art

An organic electroluminescent element (organic EL element) is a light-emitting element having a structure in which a luminescent layer including at least one organic layer that can emit light is disposed between an anode and a cathode. In this type of light-emitting element, electrons and holes are injected into the luminescent layer respectively from the cathode and the anode by applying an electric field between the cathode and the anode, and the electrons and the holes recombine with each other to form excitons in the luminescent layer. When the excitons return to the ground state, the energy is emitted as light.

The luminescent layer of a light-emitting element of this type may be formed by an ink jet method or any other liquid application (liquid phase process), as disclosed in JP-A-2009-280576. Since liquid application allows a pattern to be formed without using photolithography, the light-emitting element can be manufactured by a simple process, and the amount of material to be used can be reduced. These advantages of liquid application are markedly shown particularly in the process of forming a large number of light-emitting elements in a large panel.

In general, light-emitting elements formed through such a liquid phase process tend to exhibit a more significant rapid decrease (initial drop) in luminance with time in an early driving period than light-emitting elements formed through gas phase processes. In addition, the rapid decrease in luminance in a light-emitting element formed through a known liquid phase process may cause the emission color to change, and it is difficult to increase the life of the light-emitting element.

Probably, the cause of the luminescent color change is that, when the thickness of the luminescent layer is increased, the position and width of the luminescent region of the luminescent layer are changed, and that the optical path length in the luminescent layer is varied accordingly.

The change in the position or width of the luminescent region may be suppressed by reducing the thickness of the luminescent layer. However, if the thickness of the luminescent layer is reduced, excitons defining the luminescent region reach the layer adjacent to the luminescent layer (such as a hole transport layer or an electron transport layer). Consequently, the excitons are deactivated and the luminous efficiency is undesirably reduced. The luminance of the light-emitting element is thus reduced.

In addition, if the thickness of the luminescent layer is merely reduced, it is difficult to ensure an optical path length sufficient to produce efficient luminescence in the luminescent layer. This is also a cause of the reduction in the luminance of the light-emitting element.

SUMMARY

An advantage of some aspects of the invention is that it provides a light-emitting element that can be produced through a liquid phase process and that exhibits a high luminous efficiency and a long life and prevents or suppresses luminescent color change. Another advantage is that it provides a light-emitting device, a display device and an electronic apparatus, each including the light-emitting element.

According to an aspect of the invention, a light-emitting element is provided which includes an anode, a cathode, a luminescent layer, a first luminescence-assisting layer and a second luminescence-assisting layer. The luminescent layer is disposed between the anode and the cathode and contains a luminescent material that emits light by applying a current between the anode and the cathode, and a host material that helps the luminescent layer emit light. The first luminescence-assisting layer is disposed in contact with the luminescent layer between the anode and the luminescent layer, and contains a first luminescence-assisting material having characteristics the same as or similar to the host material. The first luminescence-assisting layer has a function of preventing the excitons from being deactivated. The second luminescence-assisting layer is disposed in contact with the luminescent layer between the cathode and the luminescent layer, and contains a second luminescence-assisting material having characteristics the same as or similar to the host material. The second luminescence-assisting layer has a function of preventing the excitons from being deactivated. The luminescent layer and the first luminescence assisting layer each contain a high-molecular-weight material.

In the light-emitting element having such a structure, the first and second luminescence-assisting layers prevent excitons generated in the luminescent layer from being deactivated. Accordingly, by reducing the thickness of the luminescent layer, the luminescent region of the luminescent layer is prevented from moving while the luminous efficiency of the light-emitting element is enhanced. Consequently, luminescent color change is prevented or suppressed.

In this embodiment, since the first luminescence-assisting material and the second luminescence-assisting material have characteristics the same as or similar to the host material in the luminescent layer, the excitons generated in the luminescent layer are prevented from being deactivated in the first or second luminescence-assisting layer. In addition, the hole transport from the first luminescence-assisting layer to the luminescent layer and the electron transport from the second luminescence-assisting layer to the luminescent layer are enhanced.

Also, since at least the luminescent layer and the first luminescence-assisting layer contain a high-molecular-weight material, the first luminescence-assisting layer, the luminescent layer and the second luminescence-assisting layer can be formed in that order in a liquid phase process.

Preferably, the light-emitting element further includes a hole transport layer capable of transporting holes between the anode and the first luminescence-assisting layer. In this instance, the first luminescence-assisting layer has a function of preventing the excitons from reaching the hole transport layer. Thus, the first luminescence-assisting layer prevents the excitons generated in the luminescent layer from being deactivated in the hole transport layer.

Preferably, the light-emitting element further includes an electron transport layer capable of transporting electrons, between the cathode and the second luminescence-assisting layer. In this instance, the second luminescence-assisting layer has a function of preventing the excitons from reaching the electron transport layer. Thus, the second luminescence-assisting layer prevents the excitons generated in the luminescent layer from being deactivated in the electron transport layer.

Preferably, the high-molecular-weight material has a cross-linked structure. The cross-linked high-molecularweight material simply and assuredly prevents the first luminescence-assisting layer and the luminescent layer from being dissolved in the solvent or dispersion medium used in the liquid phase process for forming the first luminescence-assisting layer, the luminescent layer and the second luminescence assisting layer.

Preferably, the high-molecular-weight material is an amine compound. Thus the hole transport ability of the first luminescence-assisting layer is enhanced.

Preferably, at least either the first luminescence-assisting material or the second luminescence-assisting material is the same as the hose material.

If the first luminescence-assisting material is the same as the host material, the hole transport from the first luminescence-assisting layer to the luminescent layer is enhanced. If the second luminescence-assisting material is the same as the host material, the electron transport from the second luminescence-assisting layer to the luminescent layer is enhanced.

Preferably, the luminescent layer has a thickness in the range of 10 to 50 nm. Thus the luminescent region of the luminescent layer is prevented from being moved effectively even if the carrier balance is changed in the light-emitting element.

Preferably, the first luminescence-assisting layer and the second luminescence-assisting layer each have a thickness in the range of 5 to 25 nm. Thus the excitons (region in which holes and electrons recombine) formed in the luminescent layer are prevented effectively from reaching the side of the first luminescence-assisting layer opposite the luminescent layer or the side of the second luminescence-assisting layer opposite the luminescent layer. Also, even if the thickness of the luminescent layer is reduced, an optimal optical path length for efficiently producing luminescence in the luminescent layer can be ensured.

Preferably, the total thickness of the luminescent layer, the first luminescence-assisting layer and the second luminescence-assisting layer is in the range of 40 to 80 nm. Thus an optimal optical path length for efficiently producing luminescence in the luminescent layer can be ensured.

Preferably, the second luminescence-assisting layer also contains a high-molecular-weight material. Thus the layer adjacent to the second luminescence-assisting layer, close to the cathode can be formed by a liquid phase process.

According to another aspect of the invention, a light-emitting device is provided which includes the above-described light-emitting element. The light-emitting device can emit light with a high luminous efficiency over a long time while suppressing luminescent color change.

According to still another aspect of the invention, a display device is provided which includes the above-described light-emitting element. The display device can emit light with a high luminous efficiency over a long time while suppressing luminescent color change.

According to still another aspect of the invention, an electronic apparatus is provided which includes the above-described light-emitting element. The electronic apparatus is highly reliable.

BRIEF DESCRIPTION OF THE DRAWINGS

The invention will be described with reference to the accompanying drawings, wherein like numbers reference like elements.

FIG. 3 is a vertical sectional view of a display device of an embodiment of the invention.

DESCRIPTION OF EXEMPLARY EMBODIMENTS

Preferred embodiments of the light-emitting element, the light-emitting device, the display device, and the electronic apparatus of the invention will now be described with reference to the attached drawings.

Figure 1:
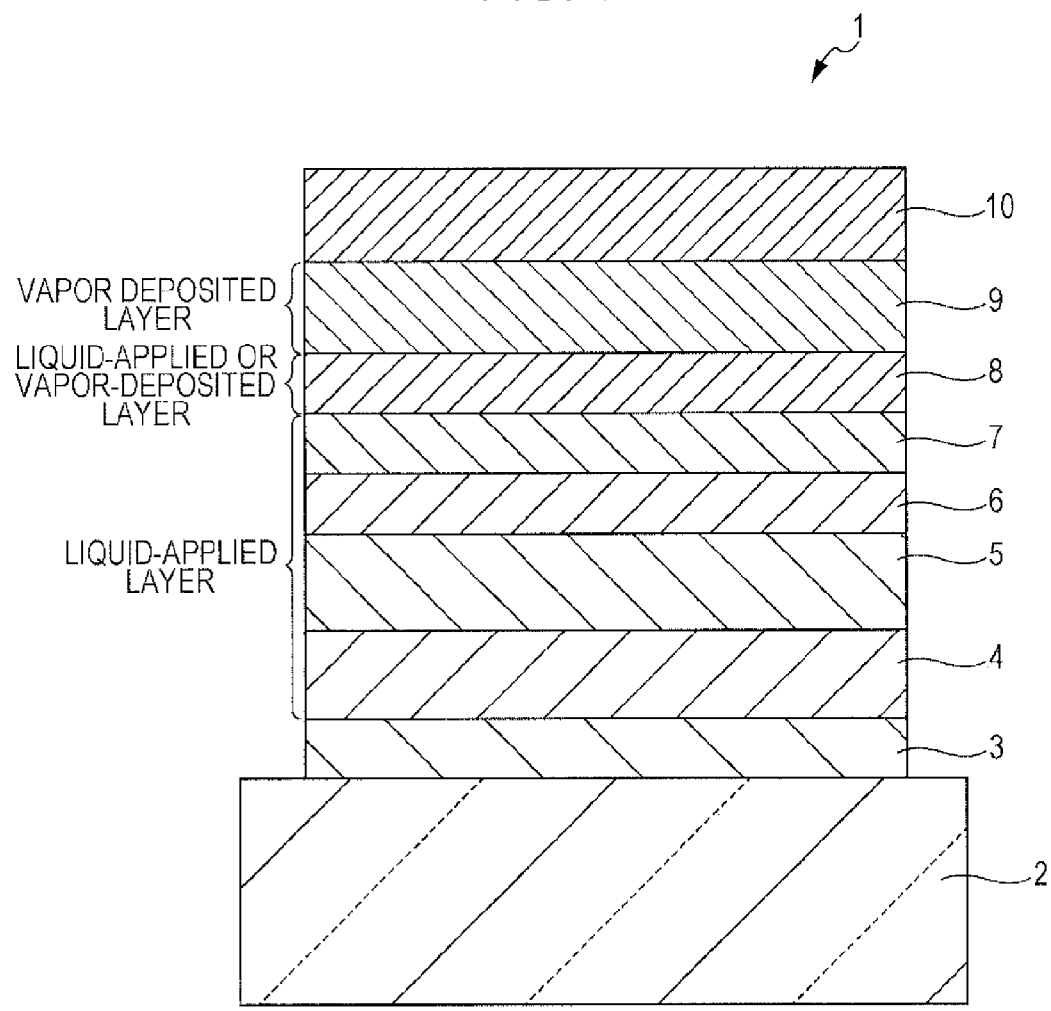
FIG. 1 is a schematic sectional view of a light-emitting element according to an embodiment of the invention.
Figure 2A:
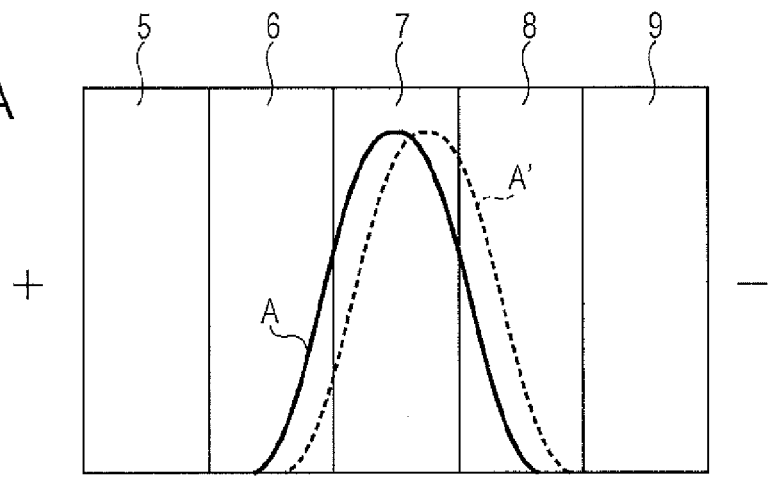
FIGS. 2A to 2C are representations illustrating the operation of the light-emitting element shown in FIG. 1.
Figure 2B:
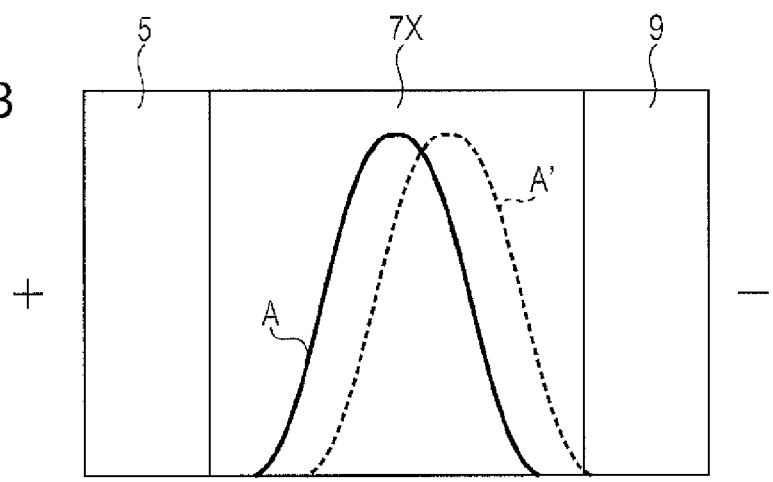
Figure 2C:
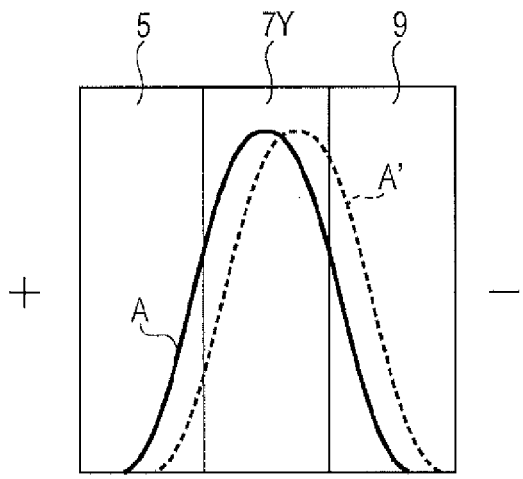

FIG. 1 is a schematic sectional view of a light-emitting element according to an embodiment of the invention, and FIGS. 2A to 2C are representations of the operation of the light-emitting element shown in FIG. 1. For convenience sake, in the following description, the upper side of FIG. 1 is described as the upper side of the structure of the light-emitting element, and similarly the lower side of the figure is described as the lower side of the structure.

The light-emitting element (electroluminescent element) 1 shown in FIG. 1 includes an anode 3, a hole injection layer 4, a hole transport layer 5, a first luminescence-assisting layer 6, a luminescent layer 7, a second luminescence-assisting layer 8, an electron transport layer 9, and a cathode 10, and these layers are formed in that order. In other words, the light-emitting element 1 has a multilayer composite including the hole injection layer 4, the hole transport layer 5, the first luminescence-assisting layer 6, the luminescent layer 7, the second luminescence-assisting layer 8 and an electron transport layer 9 that are formed in that order between the anode 3 and the cathode 10 in a direction from the anode 3 to the cathode 10.

In the light-emitting element 1, when a driving voltage has been applied between the anode 3 and the cathode 10, electrons are supplied (injected) to the luminescent layer 7 from the cathode 10, and holes are supplied (injected) to the luminescent layer 7 from the anode 3. The holes and the electrons recombine in the luminescent layer 7. The energy generated by the recombination forms excitons. When the excitons return to the ground state, energy is emitted as light (fluorescence or phosphorescence). The light-emitting element 1 thus emits light.

The substrate 2 supports the anode 3. The light-emitting element 1 of the present embodiment is of the bottom emission type, in which light is emitted through the substrate 2. Accordingly, the substrate 2 and the anode 3 are substantially transparent (clear and colorless, clear and colored, or translucent).

For example, the substrate 2 may be made of a resin, such as polyethylene terephthalate, polyethylene naphthalate, polypropylene, cycloolefin polymer, polyamide, polyethersulfone, poly(methyl methacrylate), polycarbonate, or polyacrylate, or a glass material, such as quartz glass or soda glass. These materials may be used singly or in combination.

The substrate 2 preferably has an average thickness of, but not limited to, about 0.1 to 30 mm, more preferably about 0.1 to 10 mm.

If the light-emitting element 1 is of the top emission type, in which light is emitted from the side opposite the substrate 2, the material of the substrate 2 may be transparent or opaque.

If the substrate is to be opaque, the substrate may be made of a ceramic such as alumina, a metal coated with an oxide film (insulating film) such as stainless steel, or a resin.

In the light-emitting element 1, the distance between the anode 3 and the cathode 10 (average thickness of the multilayer composite) is set according to the wavelength of the light to be emitted, and is preferably, but is not limited to, 150 to 300 nm, more preferably 150 to 250 nm, and still more preferably 160 to 200 nm.

Components of the light-emitting element 1 will be described below.

Anode

The anode 3 is an electrode that injects holes into the hole transport layer 5 through the below-described hole injection layer 4. Preferably, the anode 3 is made of, but not limited to, a material having a high work function and a high conductivity.

The anode 3 may be made of a metal oxide such as indium tin oxide (ITO), indium zinc oxide (IZO), $In_3O_3$, $SnO_2$, F-containing $SnO_2$, Sb-containing $SnO_2$, ZnO, Al-containing ZnO, or Ga-containing ZnO; or an elemental metal such as Au, Pt, Ag, or Cu, or an alloy containing these metals. These materials may be used singly or in combination.

Preferably, the anode 3 is made of ITO. ITO is transparent and has a high work function and a high conductivity. Electrons thus can be efficiently injected from the anode 3 into the hole injection layer 4.

In addition, the surface (upper surface in FIG. 1) adjacent to the hole injection layer 4 of the anode 3 is preferably subjected to plasma treatment. The chemical and mechanical stability of the joint surface between the anode 3 and the hole injection layer 4 thus can be enhanced. Consequently, holes can be more efficiently injected from the anode 3 into the hole injection layer 4. The above-mentioned plasma treatment will be described in detail later in the description of a manufacturing method of the light-emitting element 1.

The anode 3 preferably has an average thickness of, but not limited to, about 10 to 200 nm, more preferably about 50 to 150 nm.

Cathode

The cathode 10 is an electrode that injects electrons into the electron transport layer 9, which will be described later. Preferably, the cathode 10 is made of a material having a low work function. Examples of the material of the cathode 10 include Li, Mg, Ca, Sr, La, Ce, Er, Eu, Sc, Y, Yb, Ag, Cu, Al, Cs, Rb, Au, and alloys containing these metals. These materials may be used singly, or in combination (in a form of a multilayer composite or a layer made of a mixture).

If the cathode 10 is made of an alloy, it is preferable that an alloy containing a stable metal element, such as Ag, Al or Cu, be used. More specifically, alloys such as MgAg, AlLi and CuLi are preferred. These alloys can enhance the electron injection efficiency and stability of the cathode 10. The cathode 10 preferably has an average thickness of, but not limited to, about 100 to 10000 nm, more preferably about 100 to 500 nm. Since the light-emitting element 1 of the present embodiment is of the bottom emission type, the cathode 10 does not need to be optically transparent.

Hole Injection Layer

The hole injection layer 4 enhances the efficiency of hole injection from the anode 3, that is, has an ability to inject holes. By providing the hole injection layer 4 between the anode 3 and the hole transport layer 5 (described later), hole injection from the anode 3 is enhanced, so that the luminous efficiency of the light-emitting element 1 can be enhanced. The hole injection layer 4 contains a material capable of injecting holes (hole injection material).

Examples of the hole injection material include, but are not limited to, polythiophene, polyaniline, polypyrrole, poly(3, 4-ethylenedioxythiophene)/poly(styrene sulfonate) (PEDOT/PSS), copper phthalocyanine, 1,1-bis[4-(di-p-tolyl) aminophenyl]cyclohexane (TAPC), N,N'-diphenyl-N,N'-bis (3-methylphenyl)-1,1'-biphenyl-4,4'-diamine (TPD), N,N'-diphenyl-N,N'-bis(1-naphthyl)-1,1'-biphenyl-4,4'-diamine (α-NPD), 4,4',4"-tris(3-methylphenylphenylamino)triphenylamine (m-MTDATA), 4,4',4"-tris(N,N-(2-naphthyl)phenylamino)triphenylamine (2-TNATA), tris(4-carbazoyl-9-ylphenyl)amine (TCTA), Spiro-TAD, dithieno[3,2-b:2',3'-d] pyrroles (DTP), N,N'-diphenyl-p-phenylenediamine (DPPD), tri-p-tolylamine, 1,1-bis[(di-4-tolylamino)phenyl] cyclohexane, 1,3,5-tris(4-pyridyl)-2,4,6-triazine (TPT), and triphenylamine tetramer (TPTE).

Among these, polythiophene, polyaniline, polypyrrole, and PEDOT/PSS are more suitable as the hole injection material. Since these materials can be dissolved in a solvent, the hole injection layer can be formed in a liquid phase process. For example, these materials can be dissolved in glycols, such as ethylene glycol or diethylene glycol.

Furthermore, ion conductive hole injection materials that are conductive high-molecular-weight materials (or conductive oligomers) containing an electron-acceptable dopant are particularly suitable, such as PEDOT/PSS and other polythiophene hole injection materials, and polyaniline/poly(styrene sulfonate) (PANT/PSS) and other polyaniline hole injection materials. The hole injection layer 4 preferably has an average thickness of, but not limited to, about 5 to 90 nm, more preferably about 10 to 70 nm. The hole injection layer 4 may be omitted, depending on the compositions of the anode 3 and the hole transport layer 5.

Hole Transport Layer

The hole transport layer 5 transports holes injected from the anode 3 through the hole injection layer 4 into the first luminescence-assisting layer 6, and hence, the hole transport layer 5 has an ability to transport holes. By providing the hole transport layer 5 between the anode 3 and the first luminescence-assisting layer 6, holes can be efficiently transported from the anode 3 to the first luminescence-assisting layer 6. Consequently, the luminous efficiency of the light-emitting element 1 can be enhanced.

The hole transport layer 5 contains a material capable of transporting holes (hole transport material). Suitable examples of the hole transport material include triphenylamine polymers (amine compounds) such as poly(2,7-(9,9-di-n-octylfluorene)-alt-(1,4-phenylene-((4-sec-butylphenyl) imino-1,4-phenylene))) (TFB) expressed by the following formula (1), polyfluorene derivatives (PF), poly(para-phenylene vinylen) derivatives (PPV), poly(para-phenylene) derivatives (PPP), polyvinylcarbazole (PVK), polythiophene derivatives, and poly(methylphenylsilane) (PMPS) and other silane polymers. These materials can be dissolved in a solvent, and accordingly the hole transport layer can be formed in a liquid phase process.

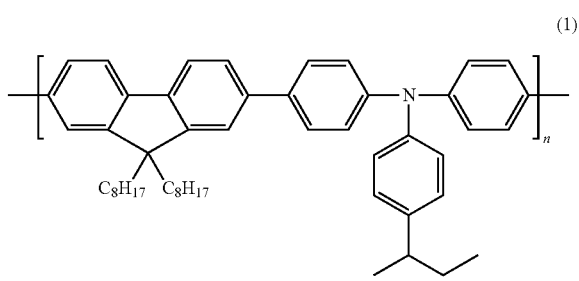
(1)

The hole transport layer 5 preferably has an average thickness of, but not limited to, about 5 to 90 nm, more preferably about 10 to 70 nm.

First Luminescence-Assisting Layer

The first luminescence-assisting layer 6 is disposed between the anode 3 and the luminescent layer 7, and more specifically in contact with the luminescent layer 7 between the hole transport layer 5 and the luminescent layer 7. The first luminescence-assisting layer 6 has a function of preventing excitons generated in the luminescent layer 7 from being deactivated. In the present embodiment, the first luminescence-assisting layer 6 has a function of preventing the excitons from reaching the hole transport layer 5. Thus, the excitons generated in the luminescent layer 7 are prevented from being deactivated in the hole transport layer 5 by the first luminescence-assisting layer 6.

The first luminescence-assisting layer 6 contains a first luminescence-assisting material having characteristics the same as or similar to the host material contained in the luminescent layer 7 (described later), and a high-molecular-weight material. Since the first luminescence-assisting material has characteristics the same as or similar to the host material in the luminescent layer 7, the excitons generated in the luminescent layer 7 are prevented from being deactivated in the first luminescence-assisting layer 6. In addition, the hole transport from the first luminescence-assisting layer 6 to the luminescent layer 7 is enhanced.

Also, since the first luminescence-assisting layer contains a high-molecular-weight material, the first luminescence-assisting layer 6 and the luminescent layer 7 can be formed in that order in a liquid phase process. Any material can be used as the first luminescence-assisting material as long as it has characteristics the same as or similar to the host material of the luminescent layer 7. Examples of the first luminescence-assisting layer 6 include 4,4'-bis(9-dicarbazolyl)-2,2'-biphenyl (CBP), bis(2-methyl-8-quinolinolate)-4-(phenylphenolate) aluminium (BAlq), N,N-dicarbazolyl-3,5-benzene:CBP derivatives (mCP), 4,4'-bis(9-carbazolyl)-2,2'-dimethylbiphenyl (CDBP), N,N'-dicarbazolyl-1,4-dimethene-benzene (DOB), 2,7-bis(diphenylphosphine oxide)-9,9-dimethylfluorene (PO6), 3,5-bis(9-carbazolyl)tetraphenylsilane (SimCP), and 1,3-bis(triphenylsilyl)benzene (UGH3).

The phrase "characteristics the same as or similar to the host material contained in the luminescent layer" implies that the ability of the luminescence-assisting material to transport excitons and carriers is the same or close to that of the host material contained in the luminescent layer, and more specifically that the HOMO and LUMO energy levels of the luminescence-assisting material are equal or close to those of the host material in the luminescent layer. The phrase "energy level is close to" implies that the difference in energy level is 0.2 eV or less.

The first luminescence-assisting material may be the same as or different from the host material contained in the luminescent layer 7, as long as it has characteristics the same as or similar to the host material. However, it is preferable that the first luminescence-assisting material be the same as the host material. Thus hole transport from the first luminescence-assisting layer 6 to the luminescent layer 7 is enhanced. The first luminescence-assisting material content in the first luminescence-assisting layer 6 is preferably, but is not limited to, 10% to 90% by weight.

The high-molecular-weight material contained in the first luminescence-assisting layer 6 makes the first luminescence-assisting layer 6 insoluble in a solvent or a dispersion medium. Such a high-molecular-weight material can be any of the above-cited hole transport materials that can be used in the hole transport layer 5. More specifically, examples of the high-molecular-weight material include triphenylamine polymers (amine compounds) such as poly(2,7-(9,9-di-n-octylfluorene)-alt-(1,4-phenylene-((4-sec-butylphenyl)imino-1,4-phenylene))) (TFB) expressed by the following formula (1), polyfluorene derivatives (PF), poly(para-phenylene vinylen) derivatives (PPV), poly(para-phenylene) derivatives (PPP), polyvinylcarbazole (PVK), polythiophene derivatives, and poly(methylphenylsilane) (PMPS) and other silane polymers.

The high-molecular-weight material preferably has a cross-linked structure. The use of a cross-linked high-molecular-weight material simply and assuredly prevents the first luminescence-assisting layer 6 from being dissolved in the solvent or dispersion medium used in the liquid phase process for forming the first luminescence-assisting layer 6 and the luminescent layer 7. Preferably, the high-molecular-weight material is the same as the hole transport material contained in the hole transport layer 5. Thus hole transport from the hole transport layer 5 to the first luminescence-assisting layer 6 is enhanced.

Preferably, the high-molecular-weight material is an amine compound such as the above-cited triphenylamine polymer. Thus the hole transport ability of the first luminescence-assisting layer 6 is enhanced. The high-molecular-weight material content in the first luminescence-assisting layer 6 is preferably, but is not limited to, 10% to 90% by weight.

Preferably, the first luminescence-assisting layer 6 has a thickness in the range of 5 to 25 nm, more preferably in the range of 10 to 25 nm, and still more preferably in the range of 15 to 25 nm. Thus the excitons (region in which holes and electrons recombine) formed in the luminescent layer 7 are prevented effectively from reaching the side of the first luminescence-assisting layer 6 opposite the luminescent layer 7 (that is, the hole transport layer 5). Also, even if the thickness of the luminescent layer 7 is reduced, an optimal optical path length for efficiently producing luminescence in the luminescent layer 7 can be ensured.

If the thickness of the first luminescence-assisting layer 6 is too small, the excitons generated in the luminescent layer 7 are likely to reach the side of the first luminescence-assisting layer 6 opposite the luminescent layer 7, depending on the spread of the excitons or the composition of the first luminescence-assisting layer 6. In contrast, if the thickness of the first luminescence-assisting layer 6 is too large, it is difficult to ensure an optimal optical path length for efficiently producing luminescence in the luminescent layer 7.

Luminescent Layer

When a current is applied between the anode 3 and the cathode 10, the luminescent layer 7 emits light. The luminescent layer 7 contains a luminescent material that emits light by applying a current, a host material that helps the luminescent material emit light, and a high-molecular-weight material.

Any luminescent material can be used without particular limitation. Fluorescent materials and phosphorescent materials may be used singly or in combination. Examples of fluorescent materials include, but are not limited to, tris(8-hydroxyquinolinolato) aluminum (Alq3), rubrene, perylene, 9,10-diphenylanthracene, tetraphenylbutadiene, vile red, coumarin 6, and quinacridone.

Examples of phosphorescent materials include, but are not limited to, fac-tris(2-phenylpyridine)iridium (Ir(ppy)$_3$), bis(2-phenylpyridinato-N,C2)iridium(acetylacetone) (ppy2Ir(acac)), bis(2-phenylbenzothiozolato-N,C2')iridium(III) (acetylacetonate) (bt2Ir(acac)), bis(2-2'-benzothienyl)pyridinato-N,C3)Iridium(acetylacetonate) (btp2Ir(acac)), iridium bis(4,6-difluorophenylpyridinato-N,C2)picolinate (FIrpic), iridium tris(1-phenyl-3-methylbenzimidazolin-2-ylidene-C,C(2)') (Ir(pmb)$_3$), Iridium(III) bis(4,6-difluorophenylpyridinato)(5-(pyridin-2-yl)tetrazolate) (FIrN4), Iridium(III) bis(4,6-difluorophenylpyridinato)(5-(pyridine-2-yl)-1,2,4-triazolate) (FIrtaz), and 2, 3, 7,8,12,13,17,18-octaethyl-21H,23H-porphine platinum(II) (PtOEP).

These luminescent materials (fluorescent materials and phosphorescent materials) may be used singly or in combination. If two or more of luminescent materials are used in combination, the luminescent layer 7 may have a multilayer structure including layers containing different luminescent materials, or may be defined by a layer made of a mixture of a plurality of luminescent materials.

The luminescent material content in the luminescent layer 7 is preferably 0.01% to 10% by weight, and more preferably 0.1% to 5% by weight. By controlling the luminescent material content in such a range, the luminous efficiency can be optimized. The host material, which helps the luminescent material emit light, functions to recombine holes and electrons to form excitons, and transfers the energy of the excitons to the luminescent material (Ferster transfer or Dexter transfer) to excite the luminescent material.

Any material having these functions can be used as the host material. Examples of the host material include 4,4'-bis(9-dicarbazolyl)-2,2'-biphenyl (CBP), bis(2-methyl-8-quinolinolato)-4-phenylphenolate aluminium (BAlq), N,N-dicarbazolyl-3,5-benzene:CBP derivative (mCP), 4,4'-bis(9-carbazolyl)-2,2'-dimethylbiphenyl (CDBP), N,N'-dicarbazolyl-1,4-dimethene-benzene (DCB), 2,7-bis(diphenylphosphine oxide)-9,9-dimethylfluorene (PO6), 3,5-bis(9-carbazolyl)tetraphenylsilane (SimCP), and 1,3-bis(triphenylsilyl)benzene (UGH3). These materials may be used singly or in combination. The host material holds the luminescent material with the high-molecular-weight material.

By adding a high-molecular-weight material to the luminescent layer 7 and the first luminescence-assisting layer 6, the first luminescence-assisting layer 6, the luminescent layer 7 and the second luminescence-assisting layer 8 can be formed in that order in a liquid phase process.

The high-molecular-weight material in the luminescent layer 7 makes the luminescent layer 7 insoluble in a solvent or a dispersion medium. Such a high-molecular-weight material can be any of the above-cited hole transport materials that can be used in hole transport layer 5. More specifically, examples of the high-molecular-weight material include triphenylamine polymers (amine compounds) such as poly(2,7-(9,9-di-n-octylfluorene)-alt-(1,4-phenylene-((4-sec-butylphenyl)imino-1,4-phenylene))) (TFB) expressed by the above formula (1), polyfluorene derivatives (PF), poly(para-phenylene vinylen) derivatives (PPV), poly(para-phenylene) derivatives (PPP), polyvinylcarbazole (PVK), polythiophene derivatives, and poly(methylphenylsilane) (PMPS) and other silane polymers.

The high-molecular-weight material preferably has a cross-linked structure. The use of cross-linked high-molecular-weight material in the luminescent layer 7 simply and assuredly prevents the luminescent layer 7 from being dissolved in the solvent or dispersion medium used in the liquid phase process for forming the luminescent layer 7 and the second luminescence-assisting layer 8. In this instance, if the high-molecular-weight material in the first luminescence-assisting layer 6 has a cross-linked structure as well, the first luminescence-assisting layer 6 and the luminescent layer 7 are simply and assuredly prevented from being dissolved in the solvent or dispersion medium used in the liquid phase process for forming the first luminescence-assisting layer 6, the luminescent layer 7 and the second luminescence-assisting layer 8.

The high-molecular-weight material in the luminescent layer 7 may be the same as or different from the high-molecular-weight material in the first luminescence-assisting layer 6, and is preferably the same. The use of the same high-molecular-weight material enhances the adhesion between the first luminescence-assisting layer 6 and the luminescent layer 7. Also, the formation of an undesired energy barrier between the first luminescence-assisting layer 6 and the luminescent layer 7 is prevented or suppressed.

In the luminescent layer 7, the ratio (A/B) of the high-molecular-weight material content A (percent by weight) to the host material content B (percent by weight) is preferably 0.1 to 2, and more preferably 0.5 to 1. Such a ratio enhances the insolubility of the luminescent layer 7 in the solvent or dispersion medium and allows the host material to help effectively the luminescent material emit light.

Preferably, the luminescent layer 7 has a thickness in the range of 10 to 50 nm, more preferably in the range of 10 to 40 nm, and still more preferably in the range of 10 to 30 nm. Thus the luminescent region of the luminescent layer 7 is prevented effectively from being moved even if the carrier balance is changed in the light-emitting element 1.

If the thickness of the luminescent layer 7 is too small, the amount of luminescence in the luminescent layer 7 tends to decrease, or the luminescent layer 7 tends to deteriorate. In contrast, if the thickness of the luminescent layer 7 is too large, the luminescent region of the luminescent layer 7 is liable to move.

Second Luminescence-Assisting Layer

The second luminescence-assisting layer 8 is disposed between the cathode 10 and the luminescent layer 7, and more specifically in contact with the luminescent layer 7 between the luminescent layer 7 and the electron transport layer 9. The second luminescence-assisting layer 8 has a function of preventing excitons generated in the luminescent layer 7 from being deactivated. In the present embodiment, the second luminescence-assisting layer 8 prevents the excitons from reaching the electron transport layer 9. Thus, the excitons generated in the luminescent layer 7 are prevented from being deactivated in the electron transport layer by the second luminescence-assisting layer 8. The second luminescence-assisting layer 8 contains a second luminescence-assisting material having characteristics the same as or similar to the host material contained in the luminescent layer 7.

Since the second luminescence-assisting material has characteristics the same as or similar to the host material in the luminescent layer 7, the excitons generated in the luminescent layer 7 are prevented from being deactivated in the second luminescence-assisting layer 8. In addition, the electron transport from the second luminescence-assisting layer 8 to the luminescent layer 7 is enhanced.

Any material can be used as the second luminescence-assisting material contained in the second luminescence-assisting layer 8 as long as it has characteristics the same as or similar to the host material of the luminescent layer 7. Examples of the second luminescence-assisting material include 4,4'-bis(9-dicarbazolyl)-2,2'-biphenyl (CBP), bis(2-methyl-8-quinolinolate)-4-(phenylphenolate) aluminium (BAlq), N,N-dicarbazolyl-3,5-benzene:CBP derivatives (mCP), 4,4'-bis(9-carbazolyl)-2,2'-dimethylbiphenyl (CDBP), N,N'-dicarbazolyl-1,4-dimethene-benzene (DCB), 2,7-bis(diphenylphosphine oxide)-9,9-dimethylfluorene (PO6), 3,5-bis(9-carbazolyl)tetraphenylsilane (SimCP), and 1,3-bis(triphenylsilyl)benzene (UGH3).

The second luminescence-assisting material may be the same as or different from the host material in the luminescent layer 7, as long as it has characteristics the same as or similar to the host material. However, it is preferable that the second luminescence-assisting material be the same as the host material. Thus electron transport from the second luminescence-assisting layer 8 to the luminescent layer 7 is enhanced. The second luminescence-assisting material content in the second luminescence-assisting layer 8 is preferably, but is not limited to, 10% to 90% by weight.

Preferably, the second luminescence-assisting layer 8 contains a high-molecular-weight material. This means it is preferable that the luminescent layer 7, the first luminescence-assisting layer 6 and the second luminescence-assisting layer 8 each contain a high-molecular-weight material. Thus the layer (electron transport layer 9 in the present embodiment) adjacent to the second luminescence-assisting layer 8, close to the cathode can be formed by a liquid phase process.

The high-molecular-weight material in the second luminescence-assisting layer 8 makes the second luminescence-assisting layer 8 insoluble in a solvent or a dispersion medium. Such a high-molecular-weight material can be any of the above-cited hole transport materials that can be used in the hole transport layer 5. More specifically, examples of the high-molecular-weight material include triphenylamine polymers (amine compounds) such as poly(2,7-(9,9-di-n-octylfluorene)-alt-(1,4-phenylene-((4-sec-butylphenyl)imino-1,4-phenylene))) (TFB) expressed by the above formula (1), polyfluorene derivatives (PF), poly(para-phenylene vinylen) derivatives (PPV), poly(para-phenylene) derivatives (PPP), polyvinylcarbazole (PVK), pelythiophene derivatives, and poly(methylphenylsilane) (PMPS) and other silane polymers.

If the layer (electron transport layer 9 in the present embodiment) adjacent to the second luminescence-assisting layer 8 and close to the cathode is formed by a liquid phase process, the high-molecular-weight material desirably has a cross-linked structure. The use of cross-linked high-molecular-weight material simply and assuredly prevents the second luminescence-assisting layer 8 from being dissolved in the solvent or dispersion medium used in the liquid phase process for forming the layer adjacent to the second luminescence-assisting layer 8 and close to the cathode.

The high-molecular-weight material in the second luminescence-assisting layer 8 may be the same as or different from the high-molecular-weight material in the luminescent layer 7, and is preferably the same. The use of the same high-molecular-weight material enhances the adhesion between the second luminescence-assisting layer 8 and the luminescent layer 7. Also, the formation of an undesired energy barrier between the second luminescence-assisting layer 8 and the luminescent layer 7 is prevented or suppressed.

Also, the high-molecular-weight material in the second luminescence-assisting layer 8 may be the same as or different from the high-molecular-weight material in the first luminescence-assisting layer 6. The high-molecular-weight material content in the second luminescence-assisting layer 8 is preferably, but is not limited to, 10% to 90% by weight. Preferably, the second luminescence-assisting layer 8 has a thickness in the range of 5 to 25 nm, more preferably in the range of 10 to 25 nm, and still more preferably in the range of 15 to 25 nm.

Thus the excitons (region in which holes and electrons recombine) formed in the luminescent layer 7 are prevented effectively from reaching the side of the second luminescence-assisting layer 8 opposite the luminescent layer 7 (that is, the electron transport layer 9). Also, even if the thickness of the luminescent layer 7 is reduced, an optimal optical path length for efficiently producing luminescence in the luminescent layer 7 can be ensured.

If the thickness of the second luminescence-assisting layer 8 is too small, the excitons generated in the luminescent layer 7 tend to reach the side of the second luminescence-assisting layer 8 opposite the luminescent layer 7, depending on the spread of the excitons or the composition of the first luminescence-assisting layer 8. In contrast, if the thickness of the second luminescence-assisting layer 8 is too large, it is difficult to ensure an optimal optical path length for efficiently producing luminescence in the luminescent layer 7.

Electron Transport Layer

The electron transport layer 9 transports electrons injected from the cathode 10 into the second luminescence-assisting layer 8. Examples of the material of the electron transport layer 9 (electron transport material) include, but are not limited to, BALq, 1,3,5-tri(5-(4-tert-butylphenyl)-1,3,4-oxadiazole (OXD-1), Bathocuproine (BCP), 2-(4-biphenyl)-5-(4-tert-butylphenyl)-1,2,4-oxadiazole (PBD), 3-(4-biphenyl)-5-(4-tert-butylphenyl)-1,2,4-triazole (TAZ), (4,4'-bis(1,1-diphenylethenyl)biphenyl (DPVBi), 2,5-bis(1-naphthyl)-1,3,4-oxadiazole (BND), 4,4'-bis(1,1-bis(4-methylphenyl) ethenyl)biphenyl (DTVBi), 2,5-bis(4-biphenylyl)-1,3,4-oxadiazole (BBD), tris(8-hydroxyquinolinato)aluminum (Alq3), oxadiazole derivatives, oxazole derivatives, phenanthroline derivatives, anthraquinodimethane derivatives, benzoquinone derivatives, naphthoquinone derivatives, anthraquinone derivatives, tetra-cyanoanthraquinodimethane derivatives, fluorenone derivatives, diphenyldicyanoethylene derivatives, diphenoquinone derivatives, and hydroxyquinoline derivatives. These electron transport materials may be used singly or in combination.

The average thickness of the electron transport layer 9 is preferably, but is not limited to, about 0.5 to 100 nm, and more preferably about 1 to 50 nm. The electron transport layer 9 and the cathode 10 may be separated by an electron injection layer that can inject electrons.

The electron injection layer is made of an electron injection material such as inorganic insulating material or an inorganic semiconductor material. Examples of the inorganic insulating material include alkali metal chalcogenides (oxides, sulfides, selenides, tellurides), alkaline-earth metal chalcogenides, alkali metal halides and alkaline-earth metal halides. These materials may be used singly or in combination.

Examples of the inorganic semiconductor material used as the electron injection material include oxides, nitrides and oxynitrides containing at least one element selected from the groups consisting of Li, Na, Ba, Ca, Sr, Yb, Al, Ga, In, Cd, Mg, Si, Ta, Sb and Zn. These materials may be used singly or in combination. The average thickness of the electron injection layer is preferably, but is not limited to, about 0.01 to 100 nm, and more preferably about 0.1 to 10 nm.

In the light-emitting element 1, when a driving voltage has been applied between the anode 3 and the cathode 10, electrons are supplied (injected) to the luminescent layer 7 from the cathode 10, and holes are supplied (injected) to the luminescent layer 7 from the anode 3. The holes and the electrons recombine in the luminescent layer 7. The energy generated by the recombination forms excitons. When the excitons return to the ground state, energy is emitted (fluorescence or phosphorescence is produced). The light-emitting element 1 thus emits light. At this time, the excitons generated in the luminescent layer 7 spread to region A in which the luminescent layer 7 lies at the center, as shown in FIG. 2A.

In the present embodiment, even if the carrier balance of the light-emitting element 1 is changed, the variation in position and width of region A can be prevented or suppressed by reducing the thickness of the luminescent layer 7. More specifically, even if region A is shifted to region A' by change in carrier balance, the position and width of region A' are hardly varied from those of region A. When the thickness of the luminescent layer 7 is reduced, region A or region A' lies beyond the luminescent layer 7, but can be within the multilayer structure including the first luminescence-assisting layer 6, the luminescent layer 7 and the second luminescence-assisting layer 8. Thus, excitons generated in the luminescent layer 7 can be prevented or inhibited from reaching the hole transport layer 5 or the electron transport layer 9.

Preferably, the total thickness of the luminescent layer 7, the first luminescence-assisting layer 6 and the second luminescence-assisting layer 8 (the thickness of the above-mentioned multilayer structure) is in the range of 40 to 80 nm. Thus an optimal optical path length for efficiently producing luminescence in the luminescent layer 7 can be ensured.

On the other hand, if the first luminescence-assisting layer 6 and the second luminescence-assisting layer 8 are not formed, and if the luminescent layer 7X between the hole transport layer 5 and the electron transport layer 9 has a large thickness, as shown in FIG. 2B, the position or width of region A, where excitons are present, is considerably varied by the change in carrier balance. More specifically, if region A is shifted to region A' by a change in carrier balance, the position and width of region A' are considerably varied from those of region A. Consequently, color is changed.

Also, if the first luminescence-assisting layer 6 and the second luminescence-assisting layer 8 are not formed, and if the luminescent layer 7Y between the hole transport layer 5 and the electron transport layer 9 has a small thickness, as shown in FIG. 2C, the portions of region A or A' outside the luminescent layer 7Y are liable to reach the hole transport layer 5 or the electron transport layer 9. Consequently, the excitons generated in the luminescent layer 7Y are deactivated. In addition, it is difficult to ensure an optimal optical path length for efficiently producing luminescence in the luminescent layer 7Y.

In the light-emitting element 1 of the present embodiment, the first luminescence-assisting layer 6 and second luminescence-assisting layer 8 prevents excitons generated in the luminescent layer 7 from being deactivated. Accordingly, by reducing the thickness of the luminescent layer 7, the luminescent region (region A) of the luminescent layer 7 is prevented from moving while the luminous efficiency of the light-emitting element is enhanced. Consequently, luminescent color change is prevented or suppressed.

In the present embodiment, since the first luminescence-assisting material and the second luminescence-assisting material have characteristics the same as or similar to the host material in the luminescent layer 7, the excitons generated in the luminescent layer 7 are prevented from being deactivated in the first luminescence-assisting layer 6 or the second luminescence-assisting layer 8. In addition, the hole transport from the first luminescence-assisting layer 6 to the luminescent layer 7 and the electron transport from the second luminescence-assisting layer 8 to the luminescent layer 7 are enhanced. Also, since at least the luminescent layer 7 and the first luminescence-assisting layer 6 contain a high-molecular-weight material, the first luminescence-assisting layer 6, the luminescent layer 7 and the second luminescence-assisting layer 8 can be formed in that order in a liquid phase process. The light-emitting element 1 may be manufactured in the following process.

(1) First, a substrate 2 is prepared, and an anode 3 is formed on the substrate 2. The anode 3 can be formed by chemical vapor deposition (CVD) such as plasma CVD or thermal CVD, dry plating such as vacuum vapor deposition, wet plating such as electroplating, thermal spraying, sol-gel method, metal organic deposition (MOD), or bonding with a conductive foil. The upper surface of the anode 3 may be subjected to oxygen plasma treatment, if necessary. This surface treatment may impart lyophilicity to the upper surface of the anode 3, remove organic deposit from the upper surface of the anode 3, and adjust the work function around the upper surface of the anode 3. Preferably, the oxygen plasma treatment is performed, for example, at a plasma power of about 100 to 800 W and an oxygen gas flow rate of about 50 to 100 mL/min while the anode 3 (member to be treated) is transported at a speed of about 0.5 to 10 mm/s with the substrate 2 heated to about 70 to 90° C.

(2) Then, a hole injection layer 4 is formed on the anode 3. The hole injection layer 4 can be formed by applying a liquid (solution or dispersion) containing a hole injection layer material onto the anode 3 and drying the liquid (removing the solvent or dispersion medium).

The liquid containing the hole injection layer material may be applied by a liquid application technique, such as spin coating, roll coating, or an ink jet method. The ink jet method is advantageous because it allows simple, precise film forming in fine areas.

Solvents or dispersion mediums that can be used for preparing the liquid containing the hole injection layer material include, but are not limited to, nitric acid, sulfuric acid, ammonia, hydrogen peroxide, water, carbon disulfide, carbon tetrachloride, and ethylene carbonate; ketones, such as methyl ethyl ketone (MEK), acetone, diethyl ketone, methyl isobutyl ketone (MIBK), methyl isopropyl ketone (MIPK), and cyclohexanone; alcohols, such as methanol, ethanol, isopropanol, ethylene glycol, diethylene glycol (DEG), and glycerol; ethers, such as diethyl ether, diisopropyl ether, 1,2-dimethoxyethane (DME),1,4-dioxane, tetrahydrofuran (THF), tetrahydropyran (THP), anisole, diethylene glycol dimethyl ether (diglyme), diethylene glycol ethyl ether (Carbitol); cellosolves, such as methyl cellosolve, ethyl cellosolve, and phenyl cellosolve; aliphatic hydrocarbons, such as hexane, pentane, and heptane; alicyclic hydrocarbons, such as cyclohexane and tetralin; aromatic hydrocarbons, such as toluene, xylene, benzene, trimethylbenzene, and tetramethylbenzene; aromatic heterocyclic compounds, such as pyridine, pyrazine, furan, pyrrole, thiophene, and methylpyrrolidone; amides, such as N,N-dimethylformamide (DMF) and N,N-dimethylacetamide (DMA); halogen-containing compounds, such as dichloromethane, chloroform, and 1,2- dichloroethane; esters, such as ethyl acetate, methyl acetate, and ethyl formate; sulfur compounds, such as dimethyl sulfoxide (DMSO) and sulfolane; nitriles, such as acetonitrile, propionitrile, and acrylonitrile; organic acids, such as formic acid, acetic acid, trichloroacetic acid, and trifluoroacetic acid; and mixed solvent of these solvents.

The applied liquid of the hole injection layer material is subjected to after-treatment, if necessary. More specifically, the applied liquid is dried. For drying, the liquid may be allowed to stand under reduced pressure, subjected to heat treatment in the range of, for example, about 40 to 80° C., or allowed to stand in nitrogen gas flow. Furthermore, the dried coating of the hole injection layer material is baked at a temperature in the range of about 100 to 300° C., if necessary. The solvent or dispersion medium remaining in the dried coating can be removed by this heating operation. If a hole injection material that will be cross-linked to turn insoluble in the solvent by heating is used, the hole injection layer 4 can be made insoluble by the above heating. The hole injection layer 4 may be rinsed (washed) with a solvent to remove the portion that has not been made insoluble. The cross link can be formed by plasma treatment or UV treatment.

(3) Then, a hole transport layer 5 is formed on the hole injection layer 4. The hole transport layer 5 can be formed by the same method (liquid phase process) as the hole injection layer 4.

(4) Then, a first luminescence-assisting layer 6 is formed on the hole transport layer 5. The first luminescence-assisting layer 6 can be formed by the same method (liquid phase process) as the hole injection layer 4.

(5) Then, a luminescent layer 7 is formed on the first luminescence-assisting layer 6. The luminescent layer 7 can be formed by the same method (liquid phase process) as the hole injection layer 4.

(6) Then, a second luminescence-assisting layer 8 is formed on the luminescent layer 7. The second luminescence-assisting layer 8 can be formed by the same method (liquid phase process) as the hole injection layer 4.

(7) Then, an electron transport layer 9 is formed on the second luminescence-assisting layer 8. The electron transport layer 9 can be formed by a gas phase process using dry plating such as vacuum vapor deposition. Alternatively, the electron transport layer 9 may be formed by applying a liquid of an electron transport layer material dissolved in a solvent or dispersed in a dispersion medium on the second luminescence-assisting layer 8, and drying the liquid (removing the solvent or dispersion medium).

(8) Subsequently, a cathode 10 is formed on the electron transport layer 9. The cathode 10 can be formed by, for example, vacuum vapor deposition, sputtering, metal foil bonding, or applying an ink containing metal particles and firing the ink. Thus, the light-emitting element 1 is produced through the above steps.

The above-described light-emitting element 1 can be used in light-emitting devices such as light sources of the exposure heads of electrophotographic printers, copying machines and facsimile machines, light sources for sensors, illumination lamps, light sources for picoprojectors (handy projectors), light sources for scanners, and light sources for the front light of reflective liquid crystal display apparatuses. Light-emitting devices using the light-emitting element 1 can efficiently emit light for a long time with luminescent color change suppressed, and are thus reliable.

The light-emitting elements 1 may be arranged in a matrix manner for, for example, a display device according to an embodiment of the invention. The display device can efficiently emit light for a long time with luminescent color change suppressed and display high-quality images for a long time, and is thus reliable. The display device may be operated by any technique without particular limitation. For example, the display device may be of active matrix type or passive matrix type. Electronic apparatuses including the light-emitting element, the light-emitting device or the display device can also be reliable.

Display Device

A display device of an embodiment of the invention will now be described. FIG. 3 is a vertical sectional view of a display device of an embodiment of the invention. The display device 100 shown in FIG. 3 includes a substrate 21, and light-emitting elements 1R, 1G and 1B and driving transistors 24 that are provided corresponding to sub pixels 100R, 100G and 100B respectively.

In the present embodiment, the display device 100 has a bottom emission structure in which lights R, G and B from the light-emitting elements 1R, 1G and 1B is transmitted through the substrate 21. The driving transistors 24 are formed on the substrate 21, and a planarizing layer 22 made of an insulting material covers the driving transistors 24.

Each driving transistor 24 includes a semiconductor layer 241 made of, for example, silicon, a gate insulating layer 242 on the semiconductor layer 241, and a gate electrode 243, a source electrode 244 and a drain electrode 245 that are formed on the gate insulating layer 242. Light-emitting elements (organic EL elements) 1R, 1G and 1B are disposed on the planarizing layer 22 so as to correspond to the driving transistors 24.

Although the light-emitting elements 1R, 1G and 1B have the same structure as the light-emitting element 1 disclosed in the above embodiment, their luminescent layers have different compositions from each other. Light-emitting element 1R includes an anode 3, a hole injection layer 4, a hole transport layer 5, a first luminescence-assisting layer 6, a luminescent layer 7R, a second luminescence-assisting layer 8, an electron transport layer 9 and a cathode 10 that are formed in that order. Light-emitting element 1G includes an anode 3, a hole injection layer 4, a hole transport layer 5, a first luminescence-assisting layer 6, a luminescent layer 7G, a second luminescence-assisting layer 8, an electron transport layer 9 and a cathode 10 that are formed in that order. Light-emitting element 1B includes an anode 3, a hole injection layer 4, a hole transport layer 5, a first luminescence-assisting layer 6, a luminescent layer 7B, a second luminescence-assisting layer 8, an electron transport layer 9 and a cathode 10 that are formed in that order.

The luminescent layer 7R of light-emitting layer 1R contains a red luminescent material so as to emit red light R. The luminescent layer 7G of light-emitting layer 1G contains a green luminescent material so as to emit green light G. The luminescent layer 7B of light-emitting layer 1B contains a blue luminescent material so as to emit blue light B.

The materials of the hole injection layer 4, the hole transport layer 5, the first luminescence-assisting layers 6 and the second luminescence-assisting layer 8 may be the same or different among the light-emitting elements 1R, 1G and 1B. The light-emitting elements 1R, 1G and 1B are separated from one another by a partition member 31.

In the present embodiment, the light-emitting elements 1R, 1G and 1B are individually formed by the partition member 31 surrounding the anode 3, the hole injection layer 4, the hole transport layer 5, the first luminescence-assisting layer 6, the luminescent layer 7 (7R, 7G, 7B) and the second luminescence-assisting layer 8 of each light-emitting element 1. The electron transport layer 9 and the cathodes 10 are each shared by the light-emitting elements 1R, 1G and 1B.

In the light-emitting elements 1R, 1G and 1B, the anode 3 acts as a pixel electrode (discrete electrode), and the cathode 10 acts as a common electrode. The anodes 3 of the light-emitting elements 1R, 1G and 1B are each electrically connected to the drain electrode 245 of the corresponding driving transistor 24 with a conductor portion (wire) 27. In the present embodiment, the light-emitting elements 1R, 1G and 1B are covered with an epoxy resin layer 35.

Furthermore, the epoxy resin layer 35 is covered with a sealing substrate 20. Thus, the light-emitting elements 1R, 1G and 1B are air-tightly enclosed and protected from oxygen and moisture, and consequently, the reliability of the light-emitting elements 1R, 1G and 1B is enhanced. The display device 100 can display full color images by emitting light in combination with the light-emitting elements 1R, 1G and 1B.

Figure 4:
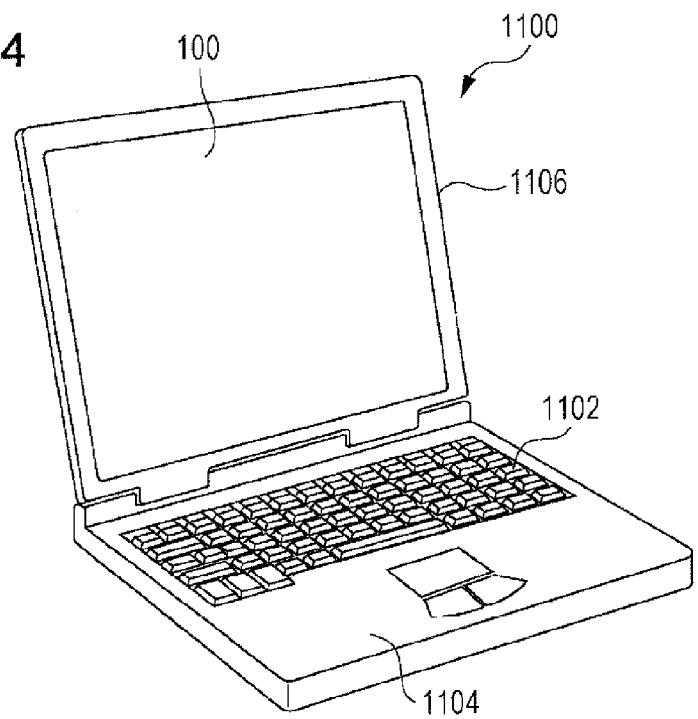
FIG. 4 is a perspective view of a mobile or notebook personal computer to which an embodiment of the electronic apparatus of the invention has been applied.

The display device 100 or a display device according to an embodiment of the invention can be incorporated in various types of electronic apparatuses. FIG. 4 is a perspective view of a mobile or notebook personal computer to which an embodiment of the electronic apparatus of the invention has been applied. In FIG. 4, the personal computer 1100 includes a body 1104 with a key board 1102, and a display unit 1106 having a display portion. The display unit 1106 is rotatably secured to the body 1104 with a hinge structure. The display portion of the display unit 1106 includes the display device 100 described above.

Figure 5:
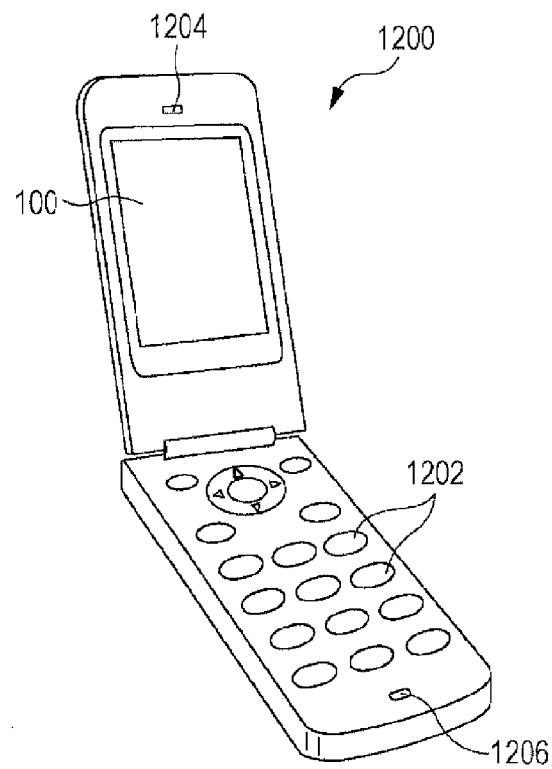
FIG. 5 is a perspective view of a mobile phone to which an embodiment of the electronic apparatus of the invention has been applied.

FIG. 5 is a perspective view of a mobile phone to which an embodiment of the electronic apparatus of the invention has been applied. In FIG. 5, the mobile phone 1200 includes a plurality of control buttons 1202, a receiver 1204, a microphone 1206, and a display portion. The display portion includes the above-described display device 100.

Figure 6:
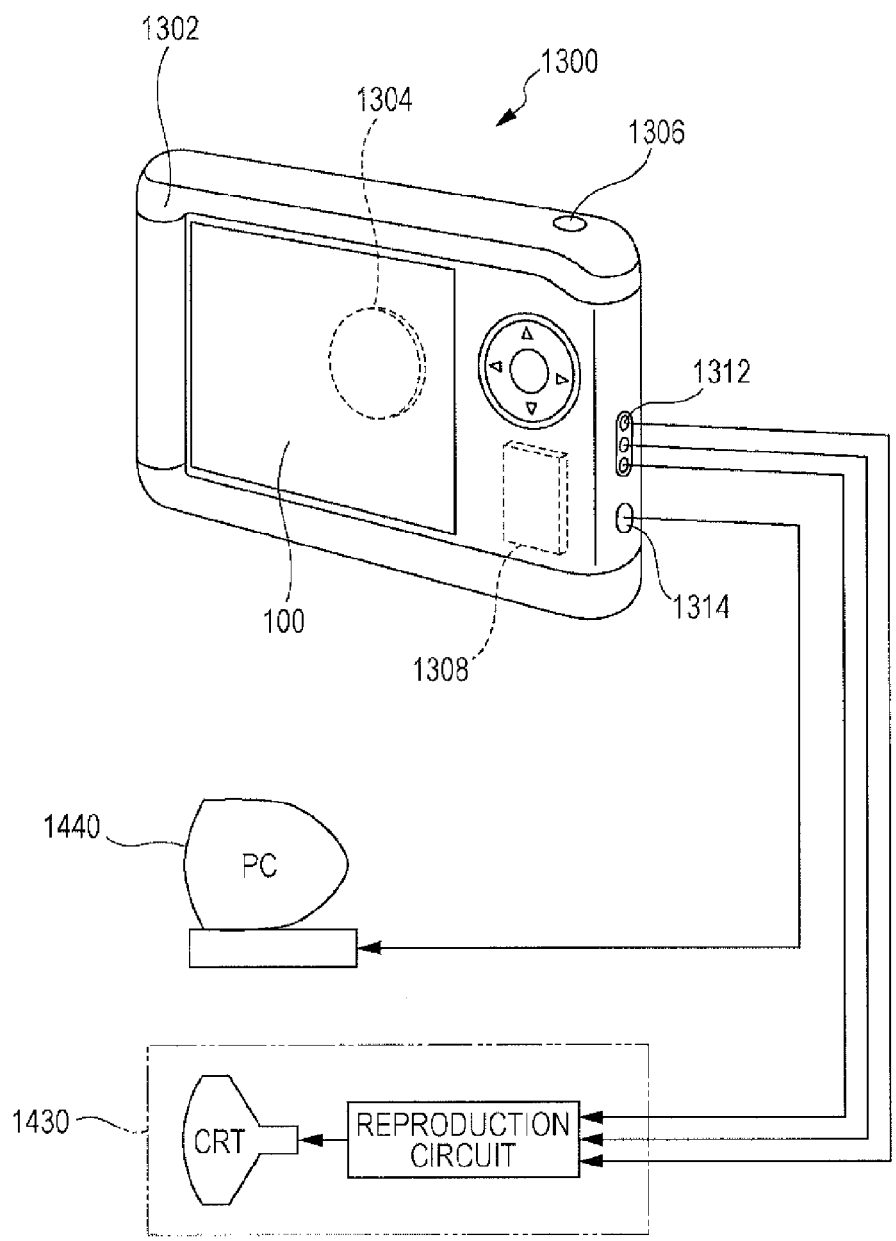
FIG. 6 is a perspective view of a digital still camera to which an embodiment of the electronic apparatus of the invention has been applied.

FIG. 6 is a perspective view of a digital still camera to which an embodiment of the electronic apparatus of the invention has been applied. FIG. 6 also schematically shows the connection between the digital still camera and external devices. While conventional cameras expose a silver halide photographic film with an optical image of an object, the digital still camera 1300 converts an optical image of an object into electrical signals with a CCD (Charge Coupled Device) to produce imaging signals (image signals).

The digital still camera 1300 includes a case or body 1302 and a display portion on the rear side of the body 1302. The display portion is configured to display images according to imaging signals of the CCD, and functions as a finder to display an object as an electronic image. In the digital still camera 1300, the display portion includes the above-described display device 100.

A circuit board 1308 is disposed within the case 1302. The circuit board 1308 includes a memory device in which imaging signals are stored. A light-receiving unit 1304 including an optical lens (imaging optical system) and the CCD is disposed on the front side of the case 1302 (rear side of the figure). The user makes sure that an object to be taken is appropriately displayed on the display portion, and presses the shutter button 1306. Then the imaging signals at that time of the CCD are transmitted to be stored to the memory device on the circuit board 1308.

The digital still camera 1300 is provided with a video signal output terminal 1312 and a data communication input terminal 1314 on a side of the case 1302. The video signal output terminal 1312 is connected to a television monitor 1430, and the data communication input terminal 1314 is connected to a personal computer 1440. The image pickup signals stored in the memory device of the circuit board 1308 are output to the television monitor 1430 or the personal computer 1440 by a predetermined operation.

The electronic apparatuses according to embodiments of the invention can be applied to television sets, video cameras, viewfinder-type or monitor-direct-view-type video tape recorders, car navigation systems, pagers, electronic notebooks (may have a communication function), electronic dictionaries, electronic calculators, electronic game machines, word processors, work stations, video phones, security video monitors, electronic binoculars, POS terminals, apparatuses with a touch panel such as cash dispensers and automatic ticket vending machines, medical instruments such as electronic thermometers, blood-pressure meters, blood glucose meters, electrocardiographic monitors, ultrasonographs and endoscope monitors, fishfinders, and other measuring apparatuses or meters for vehicles, planes and ships, flight simulators, other monitors, and projection monitors such as projectors, in addition to the personal computer (mobile personal computer) shown in FIG. 4, the mobile phone shown in FIG. 5, and the digital still camera shown in FIG. 6.

Although the light-emitting element, the light-emitting device, the display device, and the electronic apparatus have been described with reference to embodiments shown in the drawings, the invention is not limited to the disclosed embodiments.

EXAMPLES

Examples of the invention will now be described.

1. Preparation of Light-Emitting Elements

Example 1

(1) First, a transparent glass substrate having an average thickness of 0.5 mm was prepared. Then, an ITO electrode (anode) was formed to an average thickness of 100 nm on the substrate by sputtering. After being subjected to ultrasonic cleaning in acetone and 2-propanol in that order, the substrate was treated with oxygen plasma.

(2) Subsequently, the solution of 1.0% by weight of PEDOT/PSS in ethylene glycol was applied onto the ITO electrode by an ink jet method, and the coating of the solution was dried and heated to form a PEDOT/PSS hole injection layer having an average thickness of 50 nm.

(3) Then, the solution of 1.2% by weight of a precursor of the amine compound expressed by formula (1) in tetralin was applied onto the hole injection layer by an ink jet method, and the coating of the solution was dried and heated to form a hole transport layer having an average thickness of 10 nm.

(4) Then, a solution of 1.2% by weight of a first luminescence-assisting layer material in a mixed solvent of tetralin and dichloromethane (10:1) was applied onto the hole transport layer by an ink jet method, and the coating of the solution was dried and heated to form a first luminescence-assisting layer having an average thickness of 5 nm. The first luminescence-assisting layer material contained 50% by weight of CBP (first luminescence-assisting material) and 50% by weight of a precursor of the amine compound (high-molecular-weight material) expressed by formula (1).

(5) Then, a solution of 1.2% by weight of a luminescent layer material in a mixed solvent of tetralin and dichloromethane (10:1) was applied onto the first luminescence-assisting layer by an ink jet method, and the coating of the solution was dried and heated to form a green luminescent layer having an average thickness of 50 nm. The green luminescent layer material contained 5% by weight of Ir(ppy)$_3$ (luminescent material), 75% by weight of CBP (host material), and 20% by weight of a precursor of the amine compound (high-molecular-weight material) expressed by formula (1).

(6) Then, a solution of 1.2% by weight of a second luminescence-assisting layer material in a mixed solvent of tetralin and dichloromethane (10:1) was applied onto the luminescent layer by an ink jet method, and the coating of the solution was dried and heated to form a second luminescence-assisting layer having an average thickness of 5 nm. The second luminescence-assisting layer material contained 50% by weight of CBP (second luminescence-assisting material) and 50% by weight of a precursor of the amine compound (high-molecular-weight material) expressed by formula (1).

(7) Subsequently, BCP was deposited on the second luminescence-assisting layer by vacuum vapor deposition to form an electron transport layer having an average thickness of 20 nm.

(8) Then, Al was deposited on the electron transport layer by vacuum vapor deposition. Thus, an Al cathode having an average thickness of 200 nm was formed.

(9) Then, the resulting structure was covered with a glass protective cover (sealing member), and the protective cover was fixed with an epoxy resin. A light-emitting element was thus completed.

Examples 2 to 9

Light-emitting elements were prepared in the same manner as in Example 1 except that the thicknesses of the first luminescence-assisting layer, the luminescent layer and the second luminescence-assisting layer were varied as shown in Table 1.

Comparative Example

A light-emitting element was prepared in the same manner as in Example 1 except that the first and second luminescence-assisting layers were not formed.

2. Evaluation

Luminous Efficiency

A constant current was applied at a current density of 10 mA/cm$^2$ to each of the light-emitting elements of the Examples and Comparative Example, using a direct current source. The luminance of the light-emitting element at that time was measured with a luminance meter, and the luminous efficiency (luminance/current density) was evaluated. For evaluation, the luminous efficiency of each light-emitting element was normalized with respect to the luminous efficiency of Comparative Example.

Luminescence Lifetime

A constant current was continuously applied at a current density of 100 mA/cm$^2$ to each of the light-emitting elements of the Examples and Comparative Example, using a direct current source, and the time (LT50) at which the luminance was reduced to 50% of the initial luminance was obtained by measuring the luminance with a luminance meter during applying the current. For evaluation, the luminescence lifetime of each light-emitting element was normalized with respect to the luminescence lifetime of Comparative Example.

Initial Drop

A constant current was continuously applied at a current density of 100 mA/cm$^2$ to each of the light-emitting elements of the Examples and Comparative Example from a direct current source. The luminances immediately after the start of operation and after ten hours were measured, and the early decrease (initial drop) in luminance was evaluated at the three levels: large, medium and small.

Color Change

A constant current was continuously applied at a current density of 100 mA/cm$^2$ to each of the light-emitting elements of the Examples and Comparative Example from a direct current source, and the chromaticity of the light from the light-emitting element was measured with a colorimeter. The color change of the element was evaluated at the three levels: large, medium and small. Evaluation results are shown in the Table 2.

TABLE 1

|  | Hole injection layer thickness (nm) | Hole transport layer thickness (nm) | First luminescence-assisting layer thickness (nm) | Luminescent layer thickness (nm) | Second luminescence-assisting layer thickness (nm) | Electron transport layer thickness (nm) |
|---|---|---|---|---|---|---|
| Example 1 | 50 | 10 | 5 | 50 | 5 | 20 |
| Example 2 | 50 | 10 | 10 | 40 | 10 | 20 |
| Example 3 | 50 | 10 | 15 | 30 | 15 | 20 |
| Example 4 | 50 | 10 | 20 | 20 | 20 | 20 |
| Example 5 | 50 | 10 | 25 | 10 | 25 | 20 |
| Example 6 | 50 | 10 | 5 | 30 | 5 | 20 |
| Example 7 | 50 | 10 | 10 | 30 | 10 | 20 |
| Example 8 | 50 | 10 | 20 | 30 | 25 | 20 |
| Example 9 | 50 | 10 | 25 | 30 | 25 | 20 |
| Comparative Example | 50 | 10 | — | 50 | — | 20 |

TABLE 2

|  | luminous efficiency | Lifetime (LT50) | Initial drop | Color change |
|---|---|---|---|---|
| Example 1 | 1.0 | 1.1 | Medium | Medium |
| Example 2 | 1.2 | 1.2 | Small | Medium |
| Example 3 | 1.2 | 1.2 | Small | Small |
| Example 4 | 0.8 | 0.8 | Small | Small |
| Example 5 | 0.6 | 0.3 | Small | Small |
| Example 6 | 0.8 | 0.8 | Small | Small |
| Example 7 | 1.0 | 1.0 | Small | Small |
| Example 8 | 1.2 | 2.0 | Small | Small |
| Example 9 | 1.0 | 1.2 | Small | Small |
| Comparative Example | 1.0 | 1.0 | Large | Large |

Figure 7:
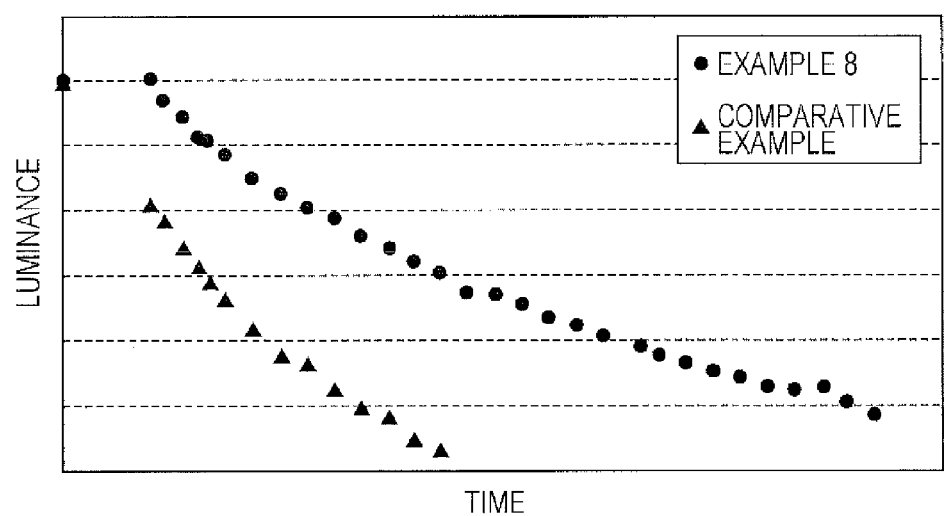
FIG. 7 is a graph of life curves, that is, changes in luminance with time, of the light-emitting elements of an Example and Comparative Example.
Figure 8A:
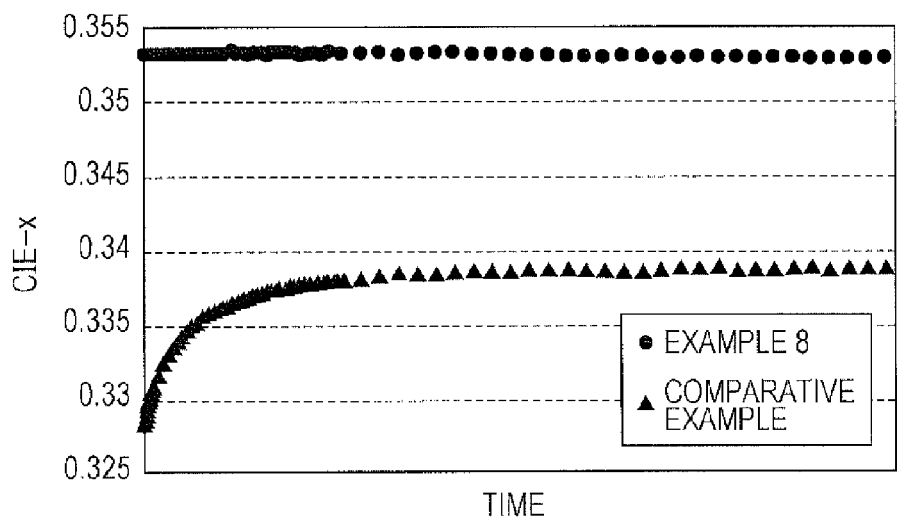
FIGS. 8A and 8B are graphs showing color changes, that is, changes in chromaticity with time, of the light-emitting elements of an Example and Comparative Example.
Figure 8B:
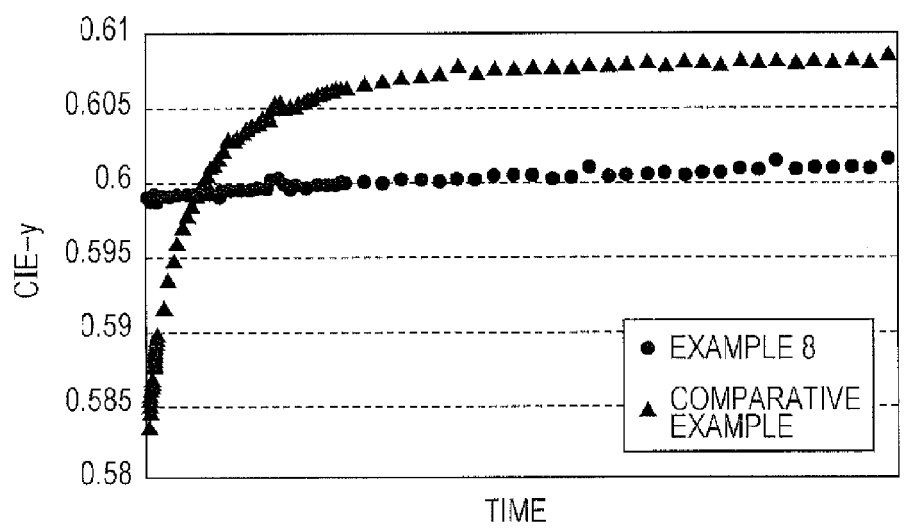

FIG. 7 shows the life curves of the light-emitting elements of Example 8 and the Comparative Example. FIG. 8 shows the color change of the light-emitting elements of Example 8 and the Comparative Example.

As is clear from Table 2, the light-emitting elements of the Examples were exhibited luminous efficiencies higher than or equal to and lifetimes longer than or equal to the light-emitting element of the Comparative Example, and in addition, their initial drop and color change were smaller than those in the Comparative Example.

The entire disclosure of Japanese Patent Application No. 2012-142406, filed Jun. 25, 2012 is expressly incorporated by reference herein.

What is claimed is:

1. A light-emitting element comprising:
an anode;
a cathode;
a luminescent layer disposed between the anode and the cathode so that excitons are generated therein, the luminescent layer containing a luminescent material that emits light by applying a current between the anode and the cathode, and a host material helping the luminescent layer emit light;
a first luminescence-assisting layer disposed in contact with the luminescent layer between the anode and the luminescent layer, the first luminescence-assisting layer containing a first luminescence-assisting material having characteristics the same as or similar to the host material and having a function of preventing the excitons from being deactivated; and
a second luminescence-assisting layer disposed in contact with the luminescent layer between the cathode and the luminescent layer, the second luminescence-assisting layer containing a second luminescence-assisting material having characteristics the same as or similar to the host material and having a function of preventing the excitons from being deactivated,
wherein the luminescent layer and the first luminescence-assisting layer each contain a high-molecular-weight material.

2. The light-emitting element according to claim 1, further comprising a hole transport layer capable of transporting holes between the anode and the first luminescence-assisting layer, wherein the first luminescence-assisting layer has a function of preventing the excitons from reaching the hole transport layer.

3. The light-emitting element according to claim 1, further comprising an electron transport layer capable of transporting electrons between the cathode and the second luminescence-assisting layer, wherein the second luminescence-assisting layer has a function of preventing the excitons from reaching the electron transport layer.

4. The light-emitting element according to claim 1, wherein the high-molecular-weight material has a cross-linked structure.

5. The light-emitting element according to claim 4, wherein the high-molecular-weight material is an amine compound.

6. The light-emitting element according to claim 1, wherein at least one of the first luminescence-assisting material and the second luminescence-assisting material is the same as the host material.

7. The light-emitting element according to claim 1, wherein the luminescent layer has a thickness in the range of 10 to 50 nm.

8. The light-emitting element according to claim 7, wherein the first luminescence-assisting layer and the second luminescence-assisting layer each have a thickness in the range of 5 to 25 nm.

9. The light-emitting element according to claim 7, wherein the total thickness of the luminescent layer, the first luminescence-assisting layer and the second luminescence-assisting layer is in the range of 40 to 80 nm.

10. The light-emitting element according to claim 1, wherein the second luminescence-assisting layer further contains a high-molecular-weight material.

11. A light-emitting device comprising the light-emitting element as set forth in claim 1.

12. A light-emitting device comprising the light-emitting element as set forth in claim 2.

13. A light-emitting device comprising the light-emitting element as set forth in claim 3.

14. A light-emitting device comprising the light-emitting element as set forth in claim 4.

15. A light-emitting device comprising the light-emitting element as set forth in claim 5.

16. A light-emitting device comprising the light-emitting element as set forth in claim 6.

17. A light-emitting device comprising the light-emitting element as set forth in claim 7.

18. A light-emitting device comprising the light-emitting element as set forth in claim 8.

19. A display device comprising the light-emitting element as set forth in claim 1.

20. An electronic apparatus comprising the light emitting element as set forth in claim 1.

* * * * *